(12) United States Patent
Panov (10) Patent No.: US 8,633,740 B2
(45) Date of Patent: Jan. 21, 2014

(54) TRIANGULAR WAVEFORM GENERATOR HAVING DIFFERENTIAL OUTPUT SYNCHRONIZED WITH EXTERNAL CLOCK SIGNAL

(75) Inventor: Georgi Panov, Munich (DE)

(73) Assignee: Intel Mobile Communications, Neubiberg (DE)

( * ) Notice: Subject to any disclaimer, the term of this patent is extended or adjusted under 35 U.S.C. 154(b) by 145 days.

(21) Appl. No.: 13/227,947

(22) Filed: Sep. 8, 2011

(65) Prior Publication Data

US 2013/0063190 A1     Mar. 14, 2013

(51) Int. Cl.
*H03K 4/06*     (2006.01)
(52) U.S. Cl.
USPC ........................................... 327/131; 327/130
(58) Field of Classification Search
USPC ......................................... 327/130, 131, 134
See application file for complete search history.

(56) References Cited

U.S. PATENT DOCUMENTS

| | | | |
|---|---|---|---|
| 6,791,405 B2 | 9/2004 | Tsuji et al. | |
| 6,956,431 B2 | 10/2005 | Maejima | |
| 7,183,818 B2 | 2/2007 | Tsuji | |
| 7,403,049 B2 | 7/2008 | Uchimoto et al. | |
| 7,557,622 B2 | 7/2009 | Stanley | |
| 7,626,430 B2 | 12/2009 | Motoyui | |
| 7,746,130 B2 | 6/2010 | Chang | |
| 7,746,260 B1 * | 6/2010 | Tu et al. .......................... | 341/144 |

* cited by examiner

*Primary Examiner* — Lincoln Donovan
*Assistant Examiner* — Diana J Cheng
(74) *Attorney, Agent, or Firm* — Eschweiler & Associates, LLC (57) ABSTRACT

One embodiment of the present invention relates to a waveform generator that includes a first pair of capacitors, a second pair of capacitors, an op amp and control logic. The op amp has inputs and provides a differential triangular waveform at its outputs as an output signal. The control logic includes capacitor control logic, ramp control logic, reset control logic and charge control logic. The capacitor control logic connects a current pair of the first and second capacitors to the inputs of the op amp. The ramp control logic provides ramp currents to the current pair. The reset control logic resets capacitors of a next pair to selected voltage(s), such as zero. The charge control logic charges the next pair of capacitors, typically after the next pair of capacitors has been driven to the selected voltage(s).

20 Claims, 8 Drawing Sheets

FIG. 1

PRIOR ART

FIG. 2

PRIOR ART

TRIANGULAR WAVEFORM GENERATOR HAVING DIFFERENTIAL OUTPUT SYNCHRONIZED WITH EXTERNAL CLOCK SIGNAL

BACKGROUND OF THE INVENTION

Analog class D audio amplifiers, also referred to as class D amplifiers, provide good power efficiency and quality output signals. Because of this, class D amplifiers are commonly used in low power applications and devices, such as portable battery powered devices. Further, analog class D audio amplifiers may reduce cost because they generally do not require an external inductance as output filter. The analog class D audio amplifiers typically use a pulse width modulator, which includes a triangular waveform generator. The triangular waveform produced by the waveform generator should be very linear, otherwise the output signal of the amplifier can be distorted.

Figure 1:
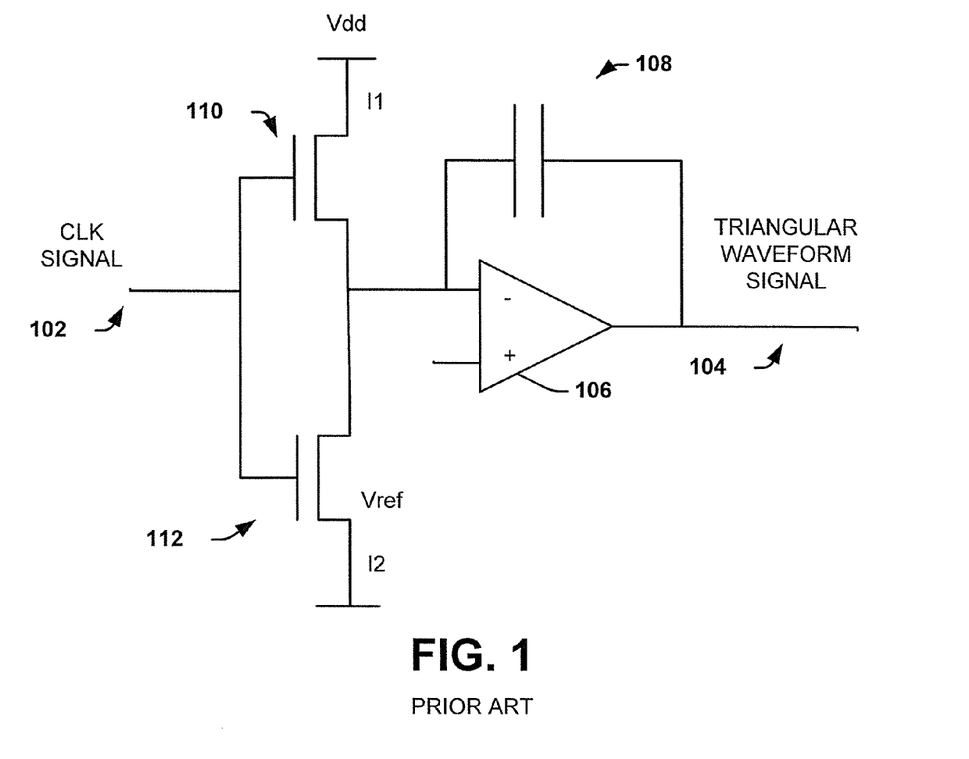
FIG. 1 is a circuit diagram illustrating a prior art waveform generating circuit.

FIG. 1 is a circuit diagram illustrating a prior art waveform generating circuit. The circuit receives a clock signal 102 and provides a triangular waveform signal as an output signal 104. The clock signal is a square wave signal.

The circuit includes an integrating circuit comprised of an op amp 106 and capacitor 108. The circuit additionally includes switchable current sources I1 110 and I2 112. Ideal circumstances include I1 and I2 being equal and the clock signal 102 to have an exact 50% duty cycle. Under these ideal circumstances, the output signal 104 is a triangular waveform with uniform characteristics including uniform peaks.

Figure 2:
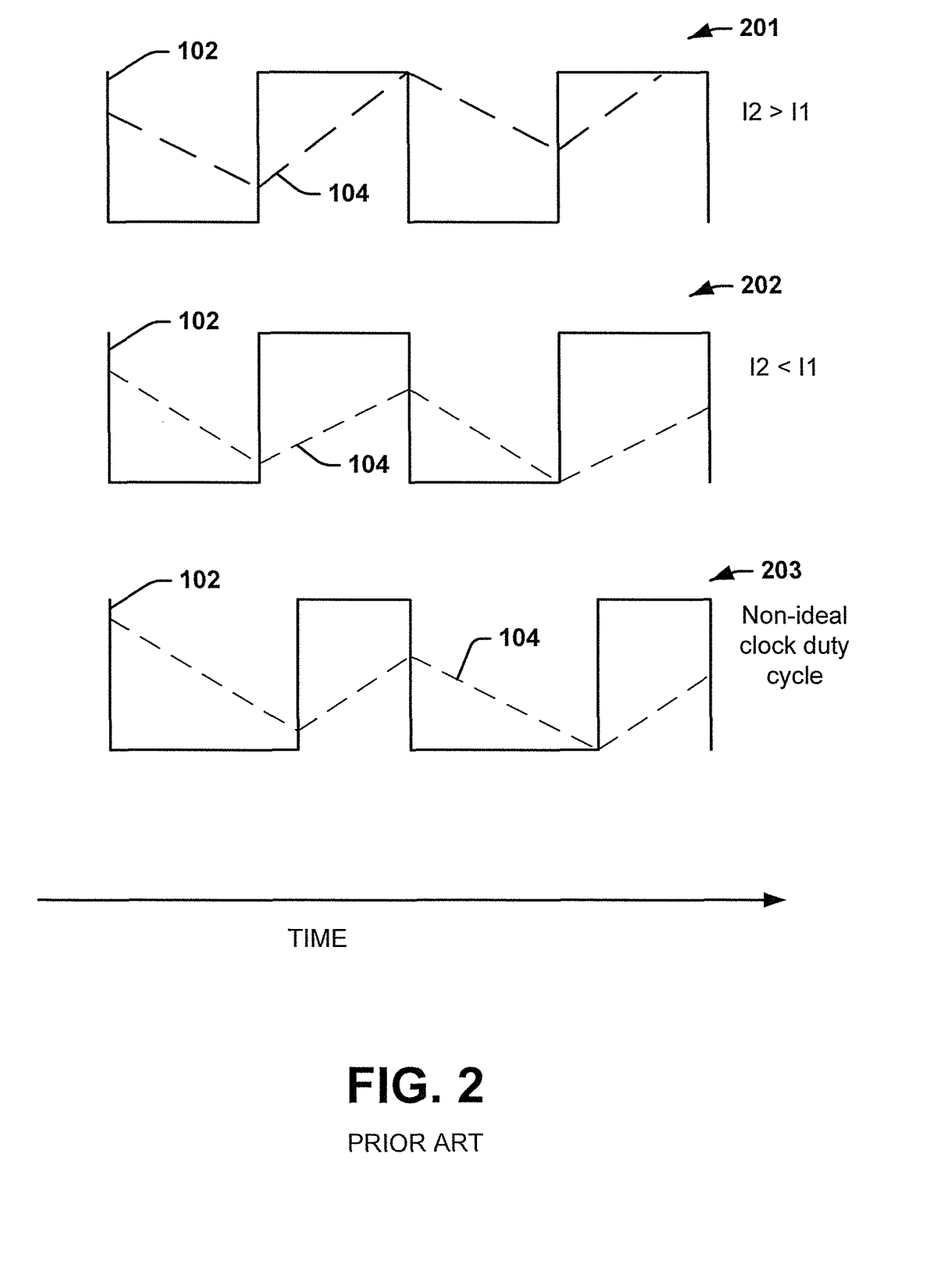
FIG. 2 is a timing diagram illustrating problems resulting from the circuit of FIG. 1.

FIG. 2 is a timing diagram illustrating problems that can occur with the waveform generating circuit shown in FIG. 1. In situation 201, the current source I2 is greater than I1. As a result, the output signal 104 drifts towards a high peak value and away from a low peak value. It can be seen that the error increases every cycle. In situation 202, the current source I2 is less than I1. Here, the output signal 104 drifts towards the low peak value and away from the high peak value. Again, it can be seen that the error accumulates every cycle. In situation 203, the duty cycle of the clock signal 102 is not 100 percent. The low portion of the clock cycle is greater than the high portion of the clock cycle. As a result, the output signal 104 accumulates error and drifts towards to low peak value and has a non-uniform duty cycle.

In another prior art waveform generator, a triangular ramp is generated by two constant currents with opposite directions, which are sequentially switched to flow through a capacitor. The switches are controlled by two comparators monitoring the output voltage. An op-amp is utilized to build an integrator with the capacitor, which ensures constant voltage drop across the current sources in order to achieve an output signal with relatively high linearity. Additionally, the circuit is self oscillating and does not utilize an external or supplied clock signal. The output signal yielded is triangular and relatively linear, however it is single ended and not synchronized with an external clock.

DETAILED DESCRIPTION OF THE INVENTION

One embodiment of the present invention relates to a waveform generator that includes a first pair of capacitors, a second pair of capacitors, an op amp and control logic. The op amp has inputs and provides a differential triangular waveform at its outputs as an output signal. The control logic includes capacitor control logic, ramp control logic, reset control logic and charge control logic. The capacitor control logic connects a current pair of the first and second capacitors to the inputs of the op amp. The ramp control logic provides ramp currents to the current pair. The reset control logic resets capacitors of a next pair to selected voltage(s), such as zero. The charge control logic charges the next pair of capacitors, typically after the next pair of capacitors has been driven to the selected voltage(s).

In another embodiment, the above embodiment further includes first and second ramp current sources that provide the ramp currents. In yet another embodiment, any of the above further include first and second charge current sources that provide charge currents to charge the next pair of capacitors. In another, any of the above wherein the reset control logic removes errors or improper voltages on the next pair of capacitors by resetting the next pair of capacitors. In another, any of the above where the current pair and the next pair switch roles every cycle. In yet another, any of the above, where the control logic operates on a clock signal, such as an external clock, and that the output signal is synchronized with the clock signal. In another, any of the above where the capacitor control logic comprises a pair of switches.

Another embodiment of the invention includes a waveform generator for generating a single ended triangular waveform. The generator includes a first capacitor, a second capacitor, an op amp and control logic. The op amp has inputs selectively or controllably connected to the first and second capacitors. The op amp has an output that provides an output signal as a single ended triangular waveform. The control logic includes capacitor control logic, ramp control logic, reset control logic and charge control logic. The capacitor control logic controllably connects one of the first and second capacitors to the input of the op amp. The connected capacitor is designated as the current capacitor. The ramp control logic controls or provides ramp currents to the current capacitor. The reset control logic is configured to reset the other capacitor of the first and second capacitors. The other capacitor is referred to as the next capacitor. The charge control logic controls charging of the next capacitor.

In yet another embodiment of the invention, a method of generating a differential triangular waveform is disclosed. First and second pairs of capacitors are provided. A current pair and a next pair are alternately selected every cycle from the first and second pairs of capacitors. The current pair is connected to inputs of an op amp. Ramp currents are provided to the inputs and the current pair. As a result, a differential triangular waveform is generated by the op amp. The next pair of capacitors is reset and then charged.

The present invention will now be described with reference to the attached drawing figures, wherein like reference numerals are used to refer to like elements throughout, and wherein the illustrated structures and devices are not necessarily drawn to scale.

Figure 3:
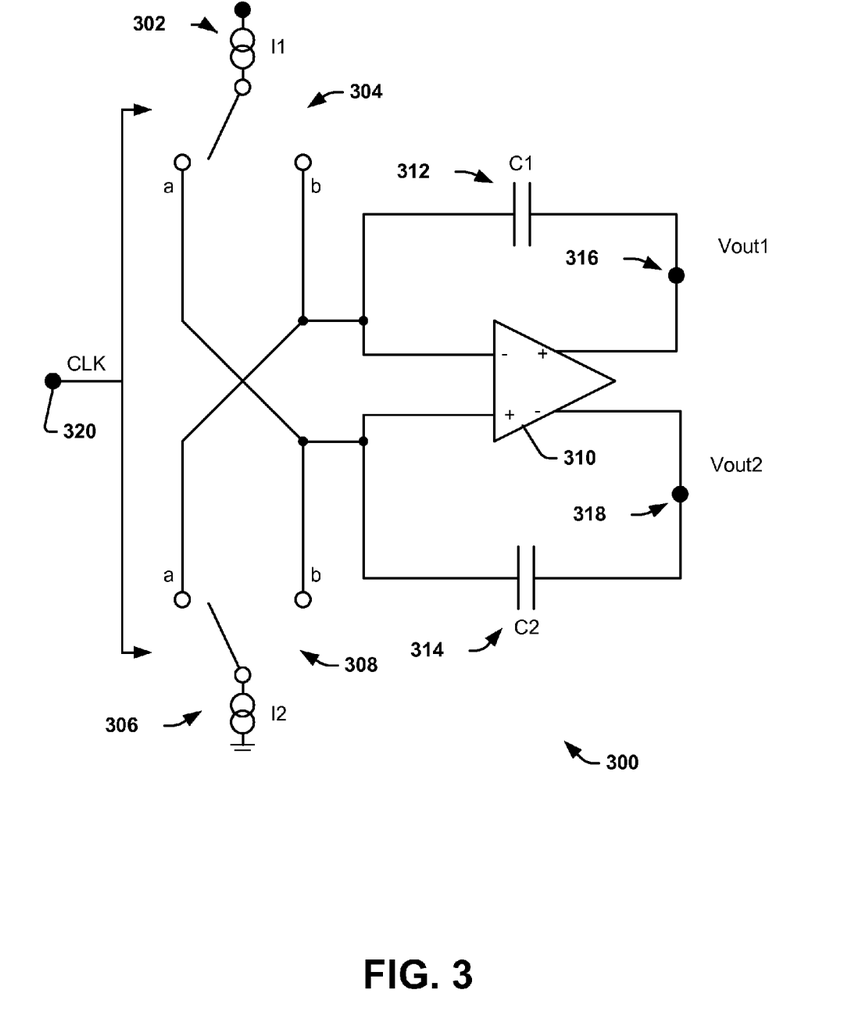
FIG. 3 is a circuit diagram of a triangular waveform generator.

FIG. 3 is a circuit diagram of a triangular waveform generator 300. The generator 300 includes a first current source 302, first switches 304, a second current source 306, second switches 308, an op amp 310, a first capacitor 312, a second capacitor 314, a first output node 316, a second output node 318, and a clock input 320.

The first current source 302 and the second current source 306 provide currents I1 and I2 of substantially similar values, but in opposite directions. In one example, I1 is 2 uA and I2 is 2 uA. The first switches 304 and the second switches 308 are coupled to the first current source 302 and the second current source 306, respectively, and can be implemented using digital logic. The first switches 304 and the second switches 308 are configured with two positions, "a" and "b".

The op amp 310 is a differential amplifier with differential inputs and outputs as shown in FIG. 3. A negative input is connected to the "a" position of the second switch 308 and the "b" position of the first switch 304. A positive input is connected to the "b" position of the second switch and the "a" position of the first switch 304. A positive output is connected to the first output node 316. A negative output is connected to the second output node 318.

The first capacitor 312 is connected to the negative input of the op amp 310, the positive output of the op amp 310, and the first output node 316. The second capacitor 314 is connected to the positive input of the op amp 310, the negative output of the op amp 310, and the second output node 318. In one example, the first capacitor 312 and the second capacitor 314 have capacitance values of 1 pF.

The clock input 320 is connected to the first switches 304 and the second switched 308. The clock input 320 provides a clock signal, also referred to as an external clock, that controls operation of the first switches 304 and the second switches 308. The clock signal is typically a square wave signal having first and second states, such as a high state or low state. In one example, the clock signal has a frequency of 600 kHz. The first output node 316 provides a first output signal, referred to as Vout1. The second output node 318 provides a second output signal, referred to as Vout2.

The first switches 304 and the second switches 308 are controlled according to the clock signal. In the first state of the clock signal, the switches 304 and 308 are in the "a" position. In this position, the current I1 flows through the second capacitor 314 and the current I2 flows through the first capacitor 312. As a result, Vout1 increases linearly and Vout2 decreases linearly.

In the second state of the clock signal, the switches 304 and 308 are in the "b" position. In this position, the current I1 flows through the first capacitor 312 and the current I2 flows through the second capacitor 314. As a result, Vout1 decreases linearly and Vout2 increases linearly. Thus, a differential triangular waveform is generated at the first output node 316 and the second output node 318 having a frequency equal to the frequency of an external clock signal.

The generated differential triangular waveform is linear because the op amp 310 maintains a constant voltage drop over the current sources 302 and 306. However, any variations in capacitance between the first capacitor 312 and the second capacitor 314, the current I1 and I2, or in the duty cycle of the clock signal can cause the rising and falling slop of the output voltages, Vout1 and Vout2, to not match. Further, integrators are created by the op amp 310, the first capacitor 312 and the second capacitor 314. The integrators accumulate the difference between the slopes in the capacitors 312 and 314 such that one of the output voltages is driven to the supply voltage and the other is driven to ground after a period of time.

Figure 4:
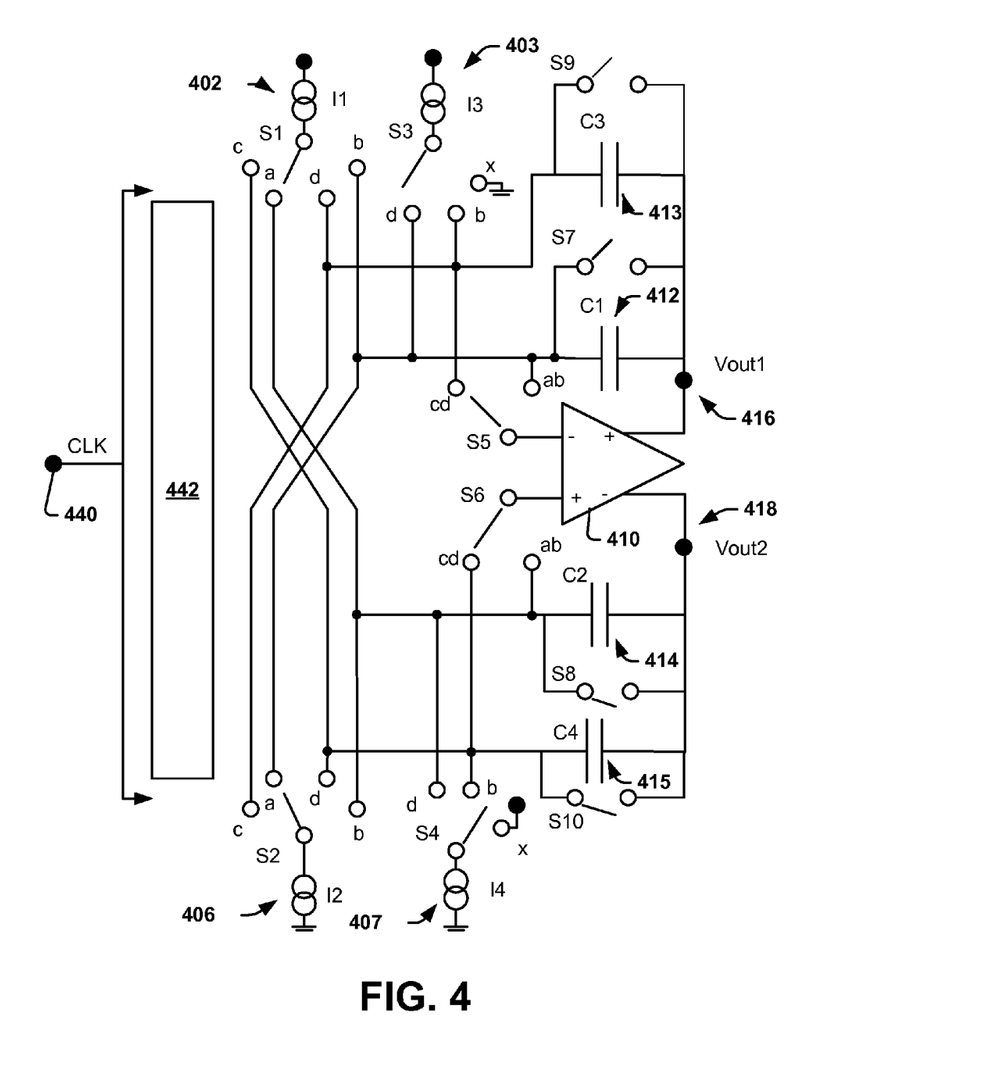
FIG. 4 is a circuit diagram illustrating a triangular waveform generator in accordance with an embodiment of the invention.

FIG. 4 is a circuit diagram illustrating a triangular waveform generator 400 in accordance with an embodiment of the invention. The generator 400 operates according to an external clock signal and generates a differential triangular waveform that is relatively linear and mitigates errors and accumulation of errors due to capacitance mismatch, current mismatch, and deviations in duty cycle (i.e., from a fifty percent duty cycle).

The differential waveform components are created with linear ramps from a selected negative voltage to a selected positive voltage centered about zero. The negative and positive components of the generated differential waveform are reflections of each other and have linear ramps between the selected negative voltage and the selected positive voltage.

The generator 400 comprises four current sources, four capacitors, control logic 442 and an op amp 410. The four current sources comprise a first current source 402, a second current source 406, a third current source 403 and a fourth current source 407. The first current source 402 provides a ramp current of I1, the second current source 406 provides a ramp current of I2, the third current source 403 provides a charge current of I3, and the fourth current source provides a charge current of I4. The first current source 402 and the second current source 406 are also referred to as ramp current sources. The third current source 403 and the fourth current source 407 are also referred to as charge current sources.

Ramp currents I1 and I2 are about the same value, but flow in opposite directions. Charge currents I3 and I4 also have about the same value, but flow in opposite directions. I1 and I3 flow in the same direction, but I1 is typically around at least twice the value of I3. Similarly, I2 and I4 flow in the same direction, but I2 is typically twice the value of I4.

In one example, I1 and I2 have current values between 2 uA and 6 uA and I3 and I4 have values between 1 uA and 3 uA.

The capacitors include a first capacitor 412, a second capacitor 414, a third capacitor 413, and a fourth capacitor 415. The first capacitor 412 has a capacitance of C1. The second capacitor 414 has a capacitance of C2. The third capacitor 413 has a capacitance of C3. The fourth capacitor 415 has a capacitance of C4. The capacitances C1, C2, C3, and C4 are relatively equal. In one example, the capacitances C1, C2, C3 and C4 are between 0.5 pF and 2 pF.

The control logic 442 controls operation and connections of the components in the generator 400. The control logic 442 includes switches S1-S10, however it is appreciated that alternate embodiments can include or omit varied numbers of switches. It is further appreciated that the control logic 442 can be implemented with alternative components and still be in accordance with the present invention.

The control logic 442 includes multiple position switches S1 to S6 and two position switches S7 to S10. The switches S1 to S6 can be implemented as multiplexors to selected positions according to a state. The switches S7 to S10 are configured to select between first and second states, such as open and closed. The control logic 442, including switches S1 to S10 typically operate according to a clock signal, also referred to as the external clock signal. The clock signal is provided the clock input 440.

Switches S1 and S2 operate as ramp control logic and control connections with the ramp current sources, the first and second current sources 402 and 406. Switches S3 and S4 operate as charge control logic and control connections with the charge current sources, the third and fourth current sources 403 and 407. Switches S5-S6 operate as capacitor control logic and control connections and alternately connect pairs of the capacitors 412-415. Switches S7-S10 operate as reset control logic.

The clock signal is typically a square wave signal and can operate with static and/or dynamic frequencies. In one example, the clock signal operates at a frequency between 500 kHz and 1000 kHz. The control logic 442 can be implemented with multiplexors and/or other types of logic. The switches S1-S10 then change states according to rising and falling edges of the clock signal. Rising edges of the clock signal set switches S1, S2 to alternate between a and c; switches S3, S4 to x; switches S5, S6 to a, b; switches S7, S8 to alternate between open and closed; and switches S9, S10 to alternate between closed and open. Falling edges of the clock signal set switches S1, S2 to alternate between b and d; switches S3, S4 to b; switches S7, S8 to alternate between no change and open; and switches S9, S10 to alternate between open and no change.

The op amp 410 acts as an integrator in conjunction with the capacitors 412, 413, 414, and 415 and provides a differential signal. A negative input of the op amp 410 is connected to switch S5 and a positive input is connected to switch S6. A positive output is coupled to a first output node 416 and a negative output of the op amp 410 is connected to a second output node 418. The first output node 416 provides signal Vout1 and the second output node 418 provides signal Vout2. The first output node 416 and the second output node 418 provide the generated differential triangular waveform signal as Vout1 and Vout2.

The currents from the first and second current sources 402 and 406 are directed through switches S1 and S2 to the positive and negative inputs of the op amp 410. The first capacitor 412 and the second capacitor 414 operate as a first pair of integrators and the third capacitor 413 and the fourth capacitor operate as a second pair. The first pair of capacitors and the second pair of capacitors alternate operating as integrating capacitors to the op amp 410 every period. The pair not operating as integrating capacitors is reset and then charged to a selected or default voltage. The reset and charge mitigates accumulation of errors due to mismatches and deviations in duty cycle.

The first pair, the first capacitor 412 and the second capacitor 414, is connected to the inputs of the op amp 410 through switches S5 and S6 when the capacitors 412 and 414 are used as integrators. During this time, the second pair, the third capacitor 413 and the fourth capacitor 415, is reset by switches S9 and S10 and then charged with currents I3 and I4 from the third current source 403 and the fourth current source 407 through switches S3 and S4. The second pair is charged in such a way that at the end of the period, the first and third capacitors 412 and 413 have the same voltage. Further, the second pair is also charged in such a way that the second and fourth capacitors 414 and 415 have the same voltage at the end of every time period.

In a next period, the second pair, the third capacitor 413 and the fourth capacitor 415, is connected to the inputs of the op amp 410 through switches S5 and S6. During this period, the first pair is reset by switches S9 and S10 and then charged with currents I3 and I4 from the third current source 403 and the fourth current source 407 through switches S3 and S4. The first pair is charged so that the first and third capacitors 412 and 413 have the same voltage at the end of the period and that the second and fourth capacitors 414 and 415 have the same voltage at the end of the period.

It is appreciated that variations in the components used, including omitting and adding components, is contemplated and in accordance with the present invention.

Figure 5:
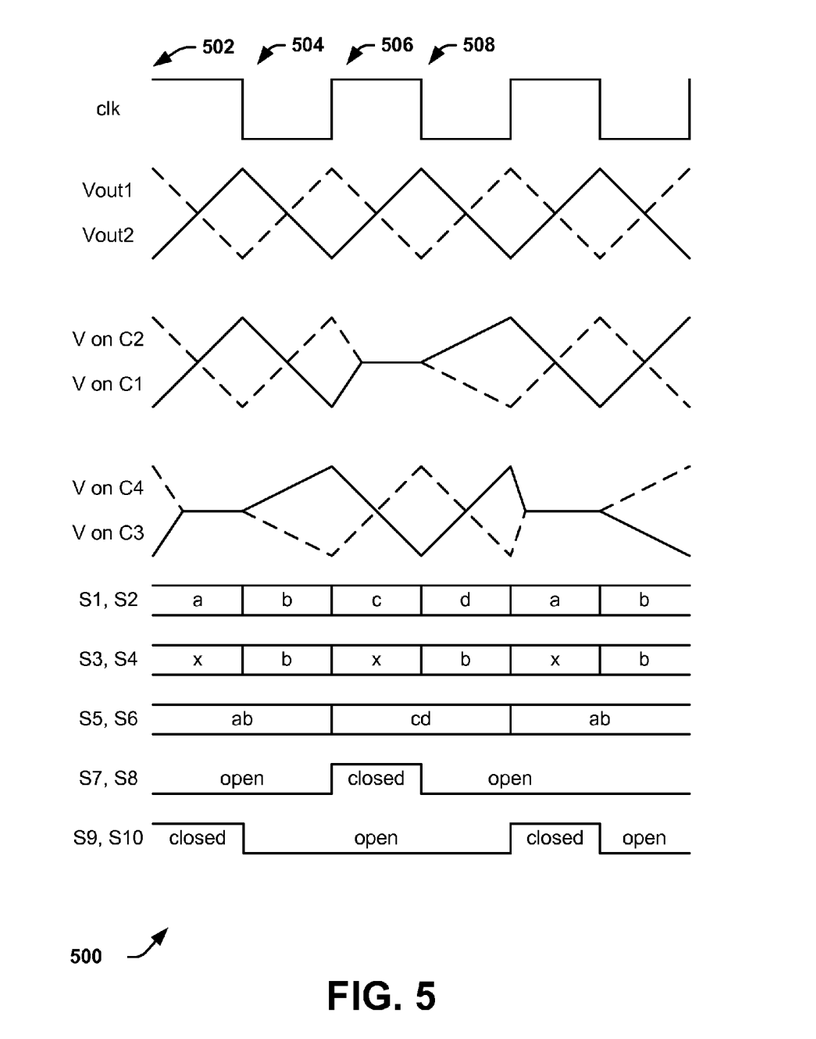
FIG. 5 is a timing diagram illustrating an example operation of a differential waveform generator in accordance with an embodiment of the invention.

FIG. 5 is a timing diagram illustrating an example operation of the differential waveform generator 400 of FIG. 4 in accordance with an embodiment of the invention.

A rising edge of the clock signal has occurred at 502. As a result, switches S1 and S2 are set to position a, switches S3 and S4 are set to position x, switches S5 and S6 are set to "ab", switches S7 and S8 are kept at open, and switches S9 and S10 are set closed. Switch S5, set to "ab", connects the first capacitor 412 to the negative input of the op amp 410 and switch S6, set to "ab", connects the second capacitor 414 to the positive input of the op amp 410. The voltage on the second capacitor 414, and on Vout1 changes from a selected positive voltage towards the selected negative voltage and the voltage on the first capacitor 412 changes from the selected negative voltage towards the selected positive voltage. Switches S9 and S10 are closed causing the voltages on the third capacitor 413 and the fourth capacitor 415 to be reset to zero.

At the falling edge 504 of the clock signal, the first pair of capacitors is still connected to the inputs of the op amp 410 and the second pair of capacitors are charged. Switches S1 and S2 are switched to position b, keeping the first pair connected to the inputs of the op amp 41, but reversing current direction. Thus, the voltage on the second capacitor 414, and on Vout1, changes from the selected negative voltage to the selected positive voltage and the voltage on the first capacitor 412 changes from the selected positive voltage to the selected negative voltage. Switches S3 and S4 are set to position b, switches S5 and S6 remain at "ab", switches S7 and S8 are kept at open, and switches S9 and S10 are set open. The switches S3 and S4 in position b cause the third current source 403 and the fourth current source 407 to charge the third capacitor 413 and the fourth capacitor 415 with current I3 and I4. Switch S5, set to "ab", keeps the first capacitor 412 connected to the negative input of the op amp 410 and switch S6, set to "ab", keeps the second capacitor 414 connected to the positive input of the op amp 410. The voltage on the second capacitor 414, and on Vout1, changes from a selected positive voltage towards the selected negative voltage and the voltage on the first capacitor 412, and on Vout2, changes from the selected negative voltage towards the selected positive voltage. Switches S9 and S10 are opened halting the reset process.

At 506, another rising edge of the clock signal occurs starting another cycle and a new time period. The first pair of capacitors is isolated from the output nodes and the second pair is connected to the output nodes 416 and 418. Switches S1 and S2 are set to position c, switches S3 and S4 are set to position x, switches S5 and S6 are set to "cd", switches S7 and S8 are set to open, and switches S9 and S10 remain open. Switch S5, set to "cd", connects the third capacitor 413 to the negative input of the op amp 410. Switch S6, set to "cd", connects the fourth capacitor 415 to the positive input of the op amp 410. The voltage on the fourth capacitor 415, and on Vout1 changes from the selected positive voltage towards the selected negative voltage and the voltage on the third capacitor 413 changes from the selected negative voltage towards the selected positive voltage. Switches S7 and S8 are closed causing the voltages on the second capacitor 414 and the first capacitor 412 to reset to zero.

At the falling edge 508 of the clock signal, the second pair of capacitors is still connected to the inputs of the op amp 410 and the first pair of capacitors is charged. Switches S1 and S2 are switched to position d, keeping the second pair connected to the inputs of the op amp 410, but reversing current direction. Thus, the voltage on the fourth capacitor 414, and on Vout1, changes from the selected negative voltage to the selected positive voltage and the voltage on the third capacitor 412, and on Vout2, changes from the selected positive voltage to the selected negative voltage. Switches S3 and S4 are set to position b, switches S5 and S6 remain at "cd", switches S7 and S8 are set at open, and switches S9 and S10 remain open. The switches S3 and S4 in position b cause the third current source 403 and the fourth current source 407 to charge the first capacitor 412 and the second capacitor 414 with currents I3 and I4. Switch S5, set to "cd", keeps the third capacitor 413 connected to the negative input of the op amp 410 and switch S6, set to "cd", keeps the fourth capacitor 415 connected to the positive input of the op amp 410. The voltage on the fourth capacitor 415, and on Vout1, changes from a selected positive voltage towards the selected negative voltage and the voltage on the third capacitor 413, and on Vout2, changes from the selected negative voltage towards the selected positive voltage. Switches S9 and S10 remain open. Switches S7 and S8 are opened halting the resetting of the first and second capacitors 412 and 414.

Figure 6:
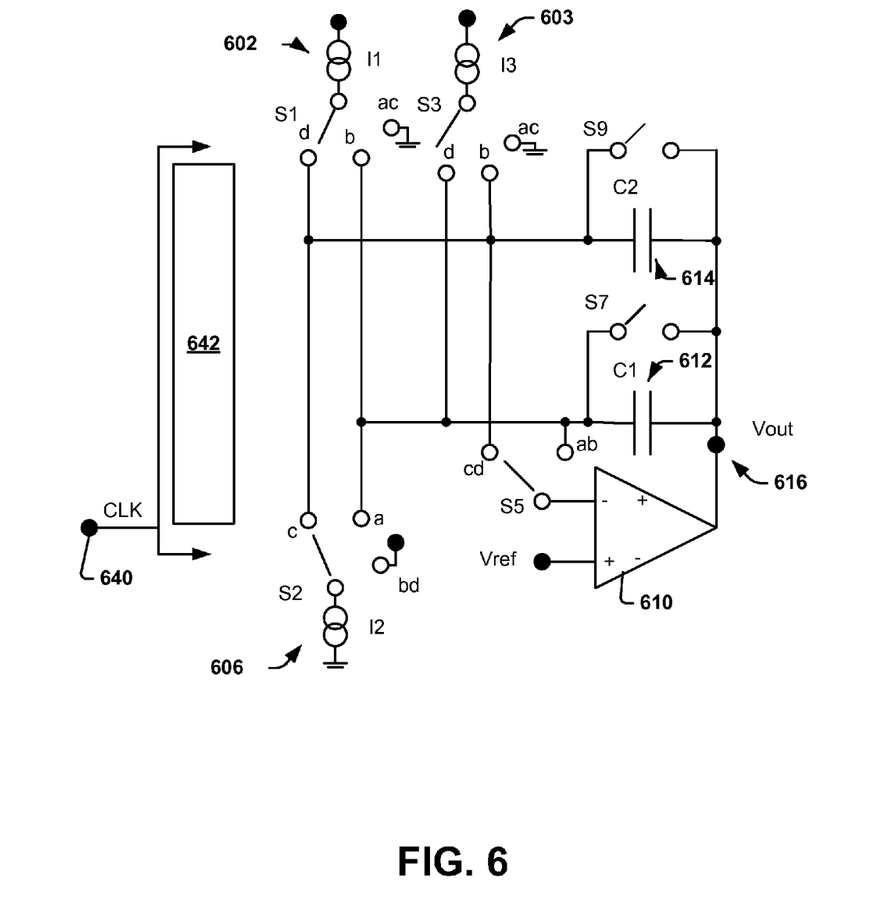
FIG. 6 is a circuit diagram illustrating a single ended triangular waveform generator in accordance with an embodiment of the invention.

FIG. 6 is a circuit diagram illustrating a single ended triangular waveform generator 600 in accordance with an embodiment of the invention. The generator 600 provides a linear triangular waveform while mitigating the impact of mismatch in capacitors and current sources and the impact of deviations from a 50 percent duty cycle.

The generator 600 includes an op amp 610, a first current source 602, a second current source 606, a third current source 603, an input clock node 640, control logic 642, output node 616, first capacitor 612, second capacitor 614 and switches S1, S2, S3, S5, S7 and S9.

The input clock node 640 provides a clock signal. The clock signal is typically a square wave signal and can operate with static and/or dynamic frequencies. In one example, the clock signal operates at a frequency between 500 kHz and 1000 kHz. The control logic 642 controls operation of the switches and can be implemented with multiplexors and/or other types of logic.

The first current source 602 and the second current source 606 provide currents I1 and I2, respectively, which have the same current value, but flow in opposite directions. The third current source 603 provides current I3 in the same direction and the first current source. The current I1 is about twice I3. The third current source 603 provides a charge current. In one example, I1 and I2 are between 2 uA and 6 uA. I3 has a current value of between 1 uA and 3 uA.

The first capacitor 612 has a capacitance of C1 and the second capacitor 614 has a capacitance of C2. C1 and C2 are about equal.

Switch S1 controls connections to the first current source 602. Switch S2 controls connections to the second current source 606. Switch S3 controls connections to the third current source 603. Switch S5 has a first position "cd" that connects the second capacitor 614 to a negative input of the op amp 610 and a second position "ab" that connects the first capacitor 612 to the negative input of the op amp. Switch S7 is for resetting the first capacitor 612. Switch S7 has a closed position that resets the first capacitor 612 and an open position that does not reset the first capacitor 612. Similarly, switch S9 has a closed position that resets the second capacitor 614 and an open position that does not reset the second capacitor 614.

During operation of the waveform generator 600, the first current source 602 and the second current source 606 are alternately connected to the negative input of the op amp 610. Thus, during a first half of a time period or cycle, the first current source 602 positively increases the voltage on one of the capacitors 612 and 614 and during a second half, the second current source 606 negatively decreases the voltage on the one of the capacitors 612 and 614. An other of the capacitors 612 and 614 is reset and then charged by the third current source 603.

An output of the op amp 610 provides an output signal having a triangular waveform. The output signal is provided at the output node 616 as a single ended triangular waveform.

Thus, every cycle roles of the first and second capacitors 612 and 614 are alternated. One of the capacitors 612 and 614 is connected to the negative input of the op amp and the other is reset and then charged. On a next cycle, their roles are reversed. As a result, accumulation of errors from mismatch and the like is mitigated.

Figure 7:
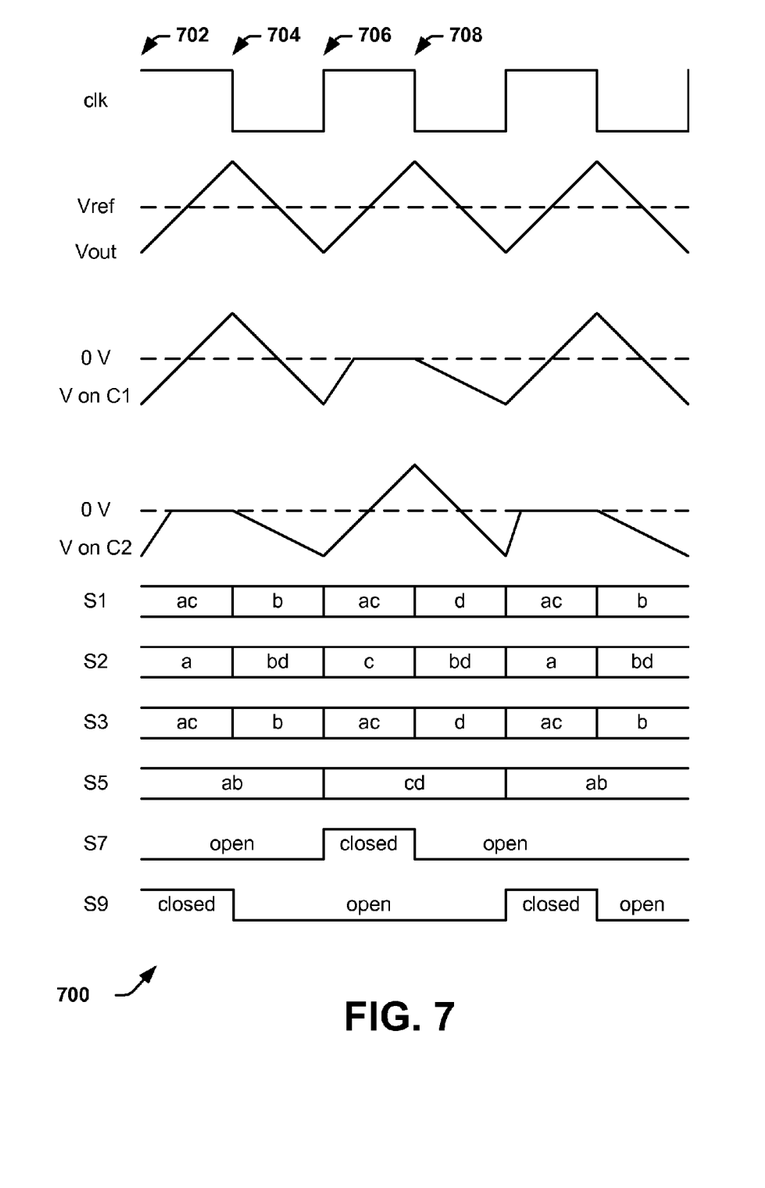
FIG. 7 is a timing diagram illustrating an example operation of a single ended triangular waveform generator in accordance with an embodiment of the invention.

FIG. 7 is a timing diagram illustrating an example operation of the single ended triangular waveform generator 600 of FIG. 6. The timing diagram is described with reference to FIG. 6 to enhance understanding. The timing diagram is provided to further illustrate the invention.

At a rising edge 702 of the clock signal sets switch S5 to ab, which connects the first capacitor 612 to the negative input of the op amp 610. Switch S9 is closed thereby resetting the second capacitor 614 toward zero volts. Switch S1 is set to position ac, thereby effectively removing the first current source 602 from the circuit/generator. Switch S3 is set to position "ac", also removing it from the generator. Switch S2 is set to a, thereby connecting the second current source 606 to the first capacitor 612 and positively increasing the voltage on the first capacitor 612, thereby linearly positively increasing the voltage on the output of the op amp to generate the output signal.

At falling edge 704 of the clock signal, switch S5 remains in position "ab" thereby maintaining connection of the first capacitor 612 to the negative input of the op amp 610. Switch S1 is set to position b, thereby connecting the first current source 602 to the first capacitor 612 and negatively decreasing the voltage on the first capacitor 612, thereby linearly negatively decreasing the voltage on the output of the op amp to generate the output signal. Switch S9 is opened and switch S2 is set to "bd", thereby removing the second current source 606. Switch S3 is set to b in order to charge the second capacitor 614 to the selected negative voltage.

At rising edge 706 of the clock signal, the first and second capacitors 612 and 614 switch roles. Switch S5 is set to "cd", which connects the second capacitor 614 to the negative input of the op amp 610. Switch S7 is closed, thereby resetting the first capacitor 612 towards zero volts. Switch S1 is set to position "ac" to disconnect the first current source 602. Switch S2 is set to c, thereby connecting the second current source 606 to the second capacitor 614 and positively increasing the voltage on the second capacitor 614, thereby linearly positively increasing the voltage on the output of the op amp 610 to generate the output signal.

At falling edge 708 of the clock signal, switch S5 remains in position "cd" thereby maintaining connection of the second capacitor 614 to the negative input of the op amp 610. Switch S1 is set to position d, thereby connecting the first current source 602 to the second capacitor 614 and negatively decreasing the voltage on the second capacitor 614, thereby linearly negatively decreasing the voltage on the output of the op amp 610 to generate the output signal. Switch S9 is opened and switch S2 is set to "bd", thereby removing the second current source 606. Switch S3 is set to d in order to charge the first capacitor 614 to the selected negative voltage.

Figure 8:
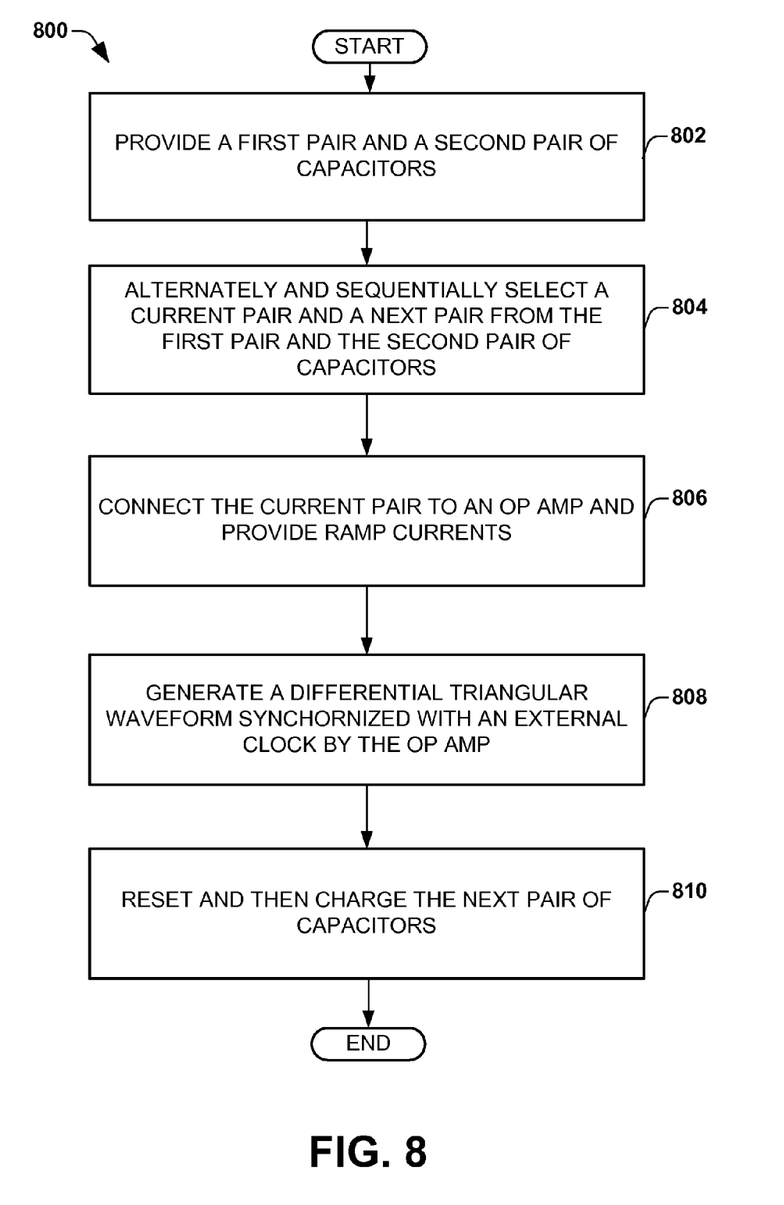
FIG. 8 is a flow diagram illustrating a method of generating a differential triangular wave form in accordance with an embodiment of the invention.

FIG. 8 is a flow diagram illustrating a method 800 of generating a differential triangular waveform in accordance with an embodiment of the invention. The method 800 is shown in an illustrated order, however it is appreciated that the invention contemplates performing the method 800 in other suitable sequences, omitting blocks, and performing additional method blocks not shown.

Understanding of the method 800 can be facilitated by referencing FIG. 4 and the associated parts of the specification; however it is appreciated that the method 800 is not limited to the circuit components described therein.

The method begins at block 802, where a first pair of capacitors and a second pair of capacitors are provided. The capacitors have substantially similar capacitance values, however a degree of mismatch is tolerated due to the operation of the method 800.

Alternately and sequentially one of the first pair and the second pair of capacitors is selected as a current pair and the other is selected as the next pair at block 804. Control logic and/or capacitor selection logic can be utilized to perform the selection, such as the logic 442 and switches S5 and S6 of FIG. 4. Generally, the selection occurs at every clock cycle. For example, in a first cycle, the first pair is selected as the current pair and the second pair is selected as the next pair, in a second cycle, the second pair is selected as the current pair and the first pair is selected as the next pair, and in a third cycle, the first pair is selected as the current pair and the second pair is selected as the next pair, and so on.

The current pair of capacitors is connected to inputs of an op amp and ramp currents are provided to the inputs and the current pair of capacitors at block 806. The ramp currents can be provided by first and second current sources, such as the sources 402 and 406 shown in FIG. 4. The ramp currents include a first ramp current provided to one of the current pair and a second ramp current provided to the other of the current pair for a first half of the cycle. In a second half of the current cycle, the first ramp current is provided to the other of the current pair and the second ramp current is provided to the one of the current pair.

A differential triangular waveform is generated at outputs of the op am at block 808. An op amp, such as op amp 410, having differential outputs is utilized.

The next pair of capacitors is reset and then charged at bock 810. The next pair of capacitors is reset by driving each capacitor towards zero volts during at least part of the first half of a clock cycle. In the second half, charge currents are provided to charge each capacitor to a selected positive or negative voltage. At this point the one of the next pair and the one of the current pair have substantially equal voltages and the other of the next pair and the other of the current pair have substantially equal voltages. Thus, when the roles of the current pair and the next pair switch, there is not distortion or deviation in the output.

The method 800 can then be repeated for a next cycle of the clock. The current and next roles of the first and second pairs can then be switched such that the previous current pair the next pair and the previous next pair is the current pair of capacitors.

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A waveform generator comprising:
   a first pair of capacitors;
   a second pair of capacitors;
   an op amp having inputs and outputs that provides an output signal; and
   control logic comprising:
      capacitor control logic configured to connect a current, single pair of the first pair and the second pair of capacitors to the inputs of the op amp;
      ramp control logic configured to provide ramp currents to the current, single pair;
      reset control logic configured to reset a next, single pair of the first and second pair of capacitors; and
   charge control logic configured to charge the next, single pair after the next, single pair has been reset.

2. The generator of claim 1, wherein the output signal is a differential triangular waveform.

3. The generator of claim 1, wherein a frequency of the output signal is determined according to an external clock.

4. The generator of claim 1, wherein the control logic operates according to a clock signal.

5. The generator of claim 4, wherein the current pair and the next pair are selected every clock cycle.

6. The generator of claim 4, wherein the current pair and the next pair alternate every clock cycle.

7. The generator of claim 1, wherein the reset control logic drives the voltage on first and second capacitors of the next pair to zero volts.

8. The generator of claim 1, wherein the charge control logic charges the next pair at currents of about half the ramp currents from zero volts.

9. The generator of claim 1, wherein the charge control logic provides a first charge current in a first direction to a first capacitor of the next pair and provides a second charge current in a second direction to a second capacitor of the next pair, the second direction being opposite the first direction.

10. The generator of claim 1, wherein the ramp currents include a first ramp current in a first direction and a second ramp current in a second direction.

11. The generator of claim 1, wherein the capacitor control logic comprises a pair of switches that select between the first pair of capacitors and the second pair of capacitors.

12. The generator of claim 1, wherein the current pair of capacitors includes a first capacitor connected to a negative input of the inputs of the op amp and a second capacitor connected to a positive input of the inputs of the op amp.

13. The generator of claim 1, wherein capacitors of the first pair of capacitors and the second pair of capacitors have substantially equal capacitance.

14. The generator of claim 1, further comprising a first ramp current source and a second ramp current source coupled to the ramp control logic.

15. A waveform generator comprising:
   a first capacitor;
   a second capacitor;
   an op amp having inputs and an output that provides an output signal, the output signal comprising a single ended triangular waveform; and
   control logic configured to operate according to a clock signal, the control logic comprising:
      capacitor control logic configured to connect a current, single capacitor of the first and second capacitors to the inputs of the op amp;
      ramp control logic configured to provide ramp currents to the current single capacitor;
      reset control logic configured to reset a next, single capacitor of the first and second capacitors; and
      charge control logic configured to charge the next, single capacitor after the next capacitor has been reset.

16. The generator of claim 15, wherein the ramp control logic alternates the direction of the ramp currents twice every cycle of the input clock.

17. The generator of claim 15, wherein the reset of the next capacitor removes errors from current mismatches and capacitor mismatches.

18. A method of generating a differential triangular waveform comprising:
   providing a first pair of capacitors and a second pair of capacitors;
   alternately selecting a current, single pair of capacitors and a next, single pair of capacitors from the first pair and the second pair of capacitors every cycle of a clock;
   connecting the current, single pair to inputs of an op amp;
   providing ramp currents to the current, single pair of capacitors;
   generating a differential triangular waveform by the op amp from the ramp currents and the current, single pair of capacitors, the differential triangular waveform being synchronized with the clock; and
   resetting and then charging the next, single pair of capacitors.

19. The method of claim 18, wherein resetting and then charging occurs concurrently with generating the differential triangular waveform.

20. The method of claim 18, wherein providing the ramp currents comprises providing a positive ramp current to a first capacitor and a negative ramp current to a second capacitor for a first half of the cycle and providing the positive ramp current to the second capacitor and the negative ramp current to the first capacitor for a second half of the cycle.

* * * * *

UNITED STATES PATENT AND TRADEMARK OFFICE
CERTIFICATE OF CORRECTION

| | |
|---|---|
| PATENT NO. | : 8,633,740 B2 |
| APPLICATION NO. | : 13/227947 |
| DATED | : January 21, 2014 |
| INVENTOR(S) | : Georgi Panov |

It is certified that error appears in the above-identified patent and that said Letters Patent is hereby corrected as shown below:

In the Claims

Column 11, Claim 15, Line 16 Please replace "to the current single capacitor;" with --to the current, single capacitor--

Signed and Sealed this
First Day of April, 2014

Michelle K. Lee
*Deputy Director of the United States Patent and Trademark Office*